(12) United States Patent
Homme et al.

(10) Patent No.: US 8,066,518 B2
(45) Date of Patent: Nov. 29, 2011

(54) WATERPROOF CONNECTOR, MOUNTING STRUCTURE OF WATERPROOF CONNECTOR AND MOUNTING METHOD OF WATERPROOF CONNECTOR

(75) Inventors: Hidetaka Homme, Inagi (JP); Ken Asakura, Toyota (JP); Shuichi Iwata, Toyota (JP)

(73) Assignees: Toyota Jidosha Kabushiki Kaisha, Aichi-ken (JP); Tyco Electronics Japan G.K., Kanagawa-ken (JP)

( * ) Notice: Subject to any disclaimer, the term of this patent is extended or adjusted under 35 U.S.C. 154(b) by 0 days.

(21) Appl. No.: 12/645,049

(22) Filed: Dec. 22, 2009

(65) Prior Publication Data

US 2010/0099279 A1     Apr. 22, 2010

Related U.S. Application Data

(63) Continuation of application No. PCT/JP2008/060874, filed on Jun. 13, 2008.

(30) Foreign Application Priority Data

Jun. 28, 2007   (JP) ................................. 2007-170745

(51) Int. Cl.
    *H01R 12/00*     (2006.01)
(52) U.S. Cl. ........................................................ 439/78
(58) Field of Classification Search ............... 439/78, 439/587, 589, 279, 595, 357
    See application file for complete search history.

(56) References Cited

U.S. PATENT DOCUMENTS

| | | | | |
|---|---|---|---|---|
| 4,676,575 A * | 6/1987 | Denlinger et al. | ............ | 439/271 |
| 4,960,391 A * | 10/1990 | Beinhaur et al. | ............... | 439/559 |
| 5,011,436 A * | 4/1991 | Waters | ........................... | 439/681 |
| 5,464,355 A * | 11/1995 | Rothenberger | ............... | 439/559 |
| 6,083,040 A | 7/2000 | Mosquera | | |
| 6,113,424 A | 9/2000 | Shinozaki | | |
| 6,132,230 A | 10/2000 | Shinozaki et al. | | |
| 6,183,275 B1 * | 2/2001 | Okura et al. | ................... | 439/157 |
| 6,459,590 B2 * | 10/2002 | Malnati | .......................... | 361/752 |
| 6,921,292 B2 * | 7/2005 | Miyazaki | ...................... | 439/564 |
| 7,234,950 B1 * | 6/2007 | Wickett | ............................ | 439/78 |
| 7,249,958 B2 * | 7/2007 | Ishikawa et al. | .............. | 439/141 |
| 2006/0178049 A1 * | 8/2006 | Ishikawa | ........................ | 439/587 |

FOREIGN PATENT DOCUMENTS

DE          3728456 A1     3/1989
(Continued)

OTHER PUBLICATIONS

PCT International Preliminary Report for co-pending International Application No. PCT/JP2008/068874, dated Feb. 4 2010. 6 pages.

(Continued)

*Primary Examiner* — Jean F Duverne
(74) *Attorney, Agent, or Firm* — Barley Snyder

(57) ABSTRACT

A waterproof connector is mounted on a circuit board fixed within an enclosure. The waterproof connector is connectable with a mating connector through a connector passageway formed in the enclosure. The waterproof connector includes a contact electrically connectable with the mating connector, an insulating housing holding the contact, a first seal disposed on a circumference of the housing, and a faceplate into which the insulating housing is inserted. The having a cylindrical section and a brim section. The cylindrical section includes a first and second open end with the brim section formed at the first open end and spreading outwards. A second seal is interposed between the first open end and the insulating housing.

11 Claims, 13 Drawing Sheets

FOREIGN PATENT DOCUMENTS

| | | |
|---|---|---|
| JP | 4-20268 | 2/1992 |
| JP | 10-021988 | 1/1998 |
| JP | 10340755 | 12/1998 |
| JP | 11-12102 | 4/1999 |
| JP | 11121102 | 4/1999 |
| JP | 2007-127206 | 5/2007 |

OTHER PUBLICATIONS

International Search Report for PCT/JP2008/060874, dated Jul. 8, 2008, 2 pages.

European Search Report dated Jun. 27, 2011, 6 pages.

* cited by examiner

WATERPROOF CONNECTOR, MOUNTING STRUCTURE OF WATERPROOF CONNECTOR AND MOUNTING METHOD OF WATERPROOF CONNECTOR

CROSS-REFERENCE TO RELATED APPLICATIONS

This application is a continuation of PCT International Application No. PCT/JP2008/060874, filed Jun. 13, 2008, which claims priority under 35 U.S.C. §119 to Japanese Patent Application No. JP 2007-170745, filed Jun. 28, 2007.

FIELD OF INVENTION

The invention relates to a waterproof connector, in particular, a mounting structure of the waterproof connector and a mounting method of the waterproof connector.

BACKGROUND

Many electronic devices, which connect to external circuits through connectors, are required to be waterproofed. For example, an automotive electronic control unit is required to be airtight, since the electronic control unit is generally mounted in a location having moisture, or where the temperature greatly varies. For an electronic device required to be airtight, there is a known structure in which a seal is disposed between an enclosure that contains an electronic circuit and a connector.

A conventions electronic device 800 is shown in FIG. 12, which includes a enclosure 803, a connector 802 fixed to the enclosure 803 with an adhesive resin 804, and a circuit board 801 fixed to the connector 802. Incidentally, illustration of components mounted on the circuit board 801, except the connector 802 is omitted. Also, illustration of an adhesive resin, which fills a space between the bottom surface of the enclosure 803 and the undersurface of the circuit board 801 so as to improve its resistance to vibration and heat radiation property, is omitted. The known electronic device 800 is assembled in such a manner that the connector 802 is fixed to and integrated with the circuit board 801 first, and subsequently, the circuit board 801 is installed in and secured to the enclosure 803. When the circuit board 801 is installed in the enclosure 803, the edge of a through-hole portion of the enclosure 803 is located at a groove formed on the circumference of the connector 802. The groove of the connector 802 is filled with an adhesive resin 804, thereby sealing a gap between the connector 802 and the enclosure 803. In this assembly, the enclosure 803, the connector 802 and the circuit board 801 are integrated.

The electronic device 800 shown in FIG. 12 has a known problem. If the number or size of components to be mounted on the circuit board 801 is increased, or if incorporate two or more circuit boards, the connector 802 is unable to support the circuit board 801. For example, solder may crack because of excessive load may be applied to a solder joint. Therefore, in order to allow for an increase in the number or sizes of components, or mounting of two or more circuit boards, it is necessary to directly install the circuit board in the enclosure. When the circuit board is directly installed in the enclosure, the position of the circuit board with respect to the enclosure deviates from a reference position in design, within installation tolerance. Further, the position of the connector with respect to the circuit board is also displaced within installation tolerance. The displacements of these positions finally appear as a displacement of the position of the connector with respect to the enclosure. In particular, when a displacement of the position of the circuit board with respect to the enclosure and a displacement of the position of the connector with respect to the circuit board take place in the same direction, the displacements amass, resulting in a larger displacement.

However, the known electronic device 800, shown in FIG. 12, hardly allows for positional displacement between the connector 802 and the enclosure 803. This is because if displacement of the position is increased, there is a possibility that the connector 802 cannot be installed in the enclosure 803. Also, even if the through-hole portion of the enclosure 803 is made larger, there is a possibility that the gap between the enclosure 803 and the connector 802 cannot be filled with the adhesive resin 804.

FIG. 13 illustrates another example of the internal structure of a known conventional electronic device 900, which includes a circuit board 901 fixed to a enclosure 903 having a enclosure main body 903a and a enclosure faceplate 903b, while an internal connector 907 is fixed to the circuit board 901. An external connector 902 is further included, which connects to a mating connector (not illustrated). The external connector 902 has a flange 902a that abuts on a through-hole portion of the enclosure 903. A gap between an abutting surface of the flange 902a of the external connector 902 and the enclosure 903 is sealed by an elastomeric seal 904. The external connector 902 is connected to a relay connector 906 through internal wires 905. The relay connector 906 then connected to the internal connector 907 fixed to the circuit board 901. In the electronic device 900, because the gap between the flange 902a of the external connector 902 and the enclosure 903 is sealed by the seal 904, it is possible to make the through-hole portion of the enclosure 903 larger and also to set a less strict tolerance for the installation position of the external connector 902, as compared to that in the structure shown in FIG. 12. Further, according to the electronic device 900, the position of the external connector 902 with respect to the enclosure 903 is not affected by a displacement in installation position between the circuit board 901 and the enclosure 903 and a displacement in installation position between the internal connector 907 and the circuit board 901.

The electronic device 900, shown in FIG. 13, can improve the degree of flexibility in layout due to the structure using internal wires. On the other hand, however, the electronic device 900 requires the internal connector 907, the relay connector 906 and the internal wires 905 besides the external connector 902, thereby increasing the number of components. Also, connection work and the like within the enclosure 903 are necessary.

SUMMARY

An object of the invention is to provide a waterproof connector that is easily and reliably assembled, and also to provide a mounting structure and a mounting method of the waterproof connector.

The waterproof connector includes a contact electrically connectable with a mating connector, an insulating housing holding the contact, a first seal disposed on a circumference of the housing, and a faceplate into which the insulating housing is inserted. The having a cylindrical section and a brim section. The cylindrical section includes a first and second open end with the brim section formed at the first open end and spreading outwards. A second seal is interposed between the first open end and the insulating housing.

DETAILED DESCRIPTION OF THE EMBODIMENT(S)

An embodiment of the present invention will be described as follows with reference to the drawings.

Figure 1:
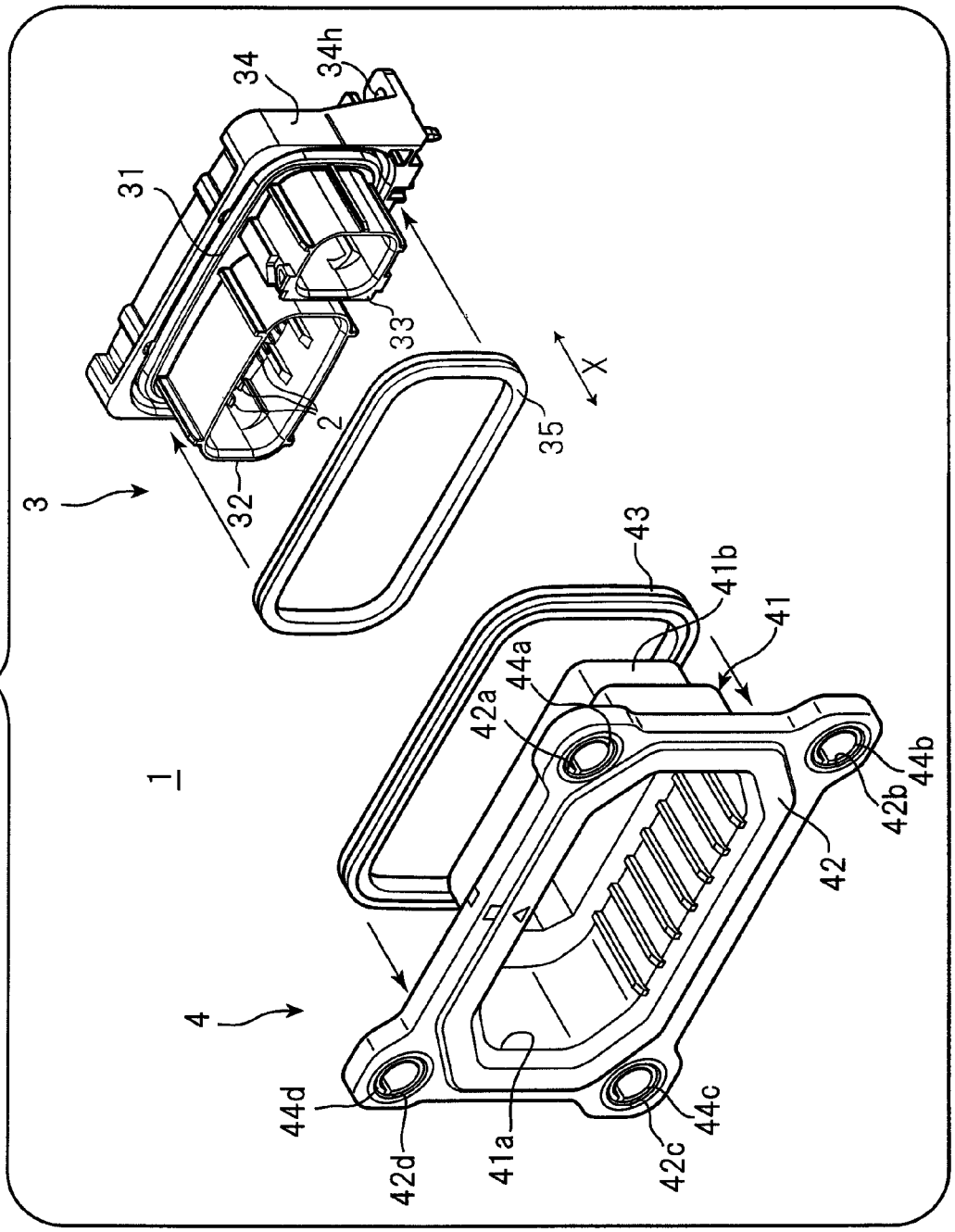
FIG. 1 is an exploded perspective view of a waterproof connector according to the invention.
Figure 2:
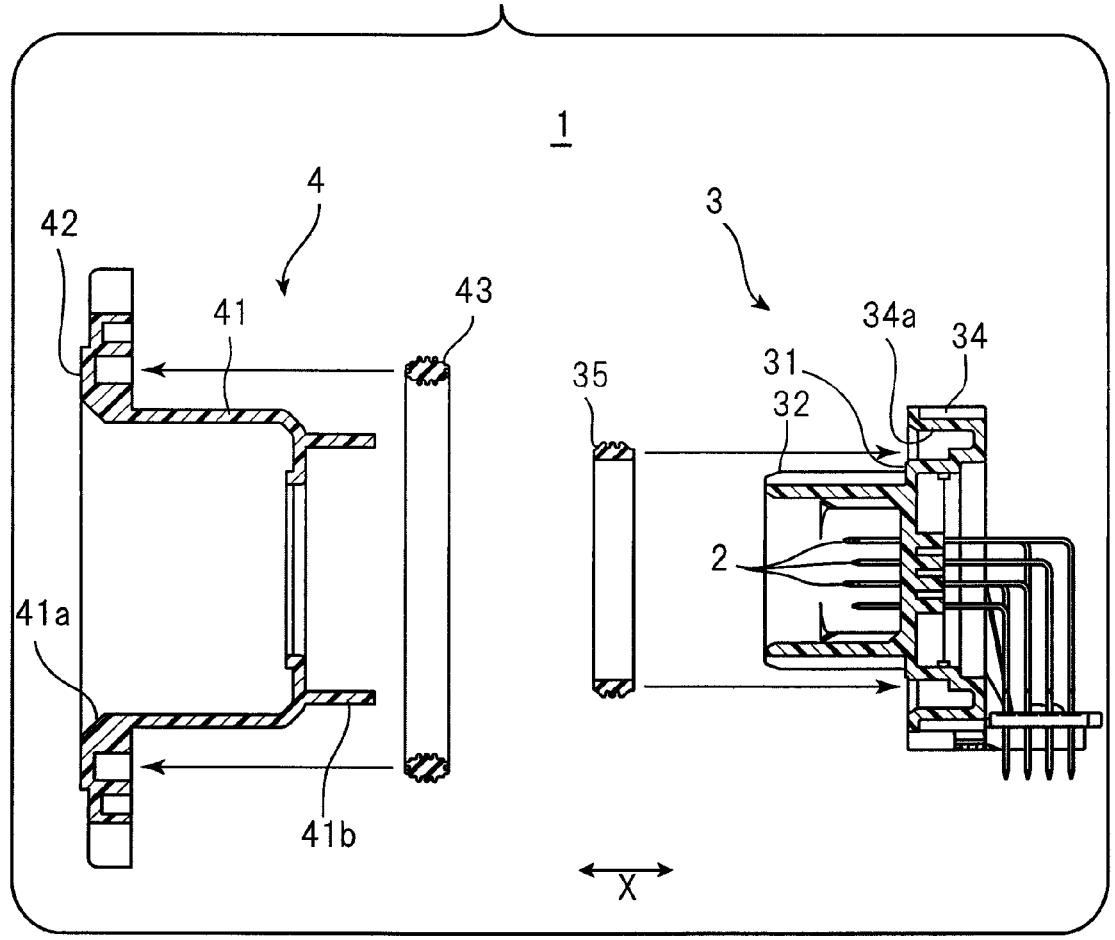
FIG. 2 is a cross-sectional view of the waterproof connector shown in FIG. 1.

A waterproof connector 1, shown in FIG. 1 and FIG. 2, is a female connector type for implementation on a circuit board 6 disposed in a enclosure 5. The waterproof connector 1 includes contacts 2 for electrical connection, an insulating housing 3 holding the contacts 2 and to be mated with a male connector (see FIG. 10) that is a mating connector 7, and a faceplate 4 to be coupled to the insulating housing 3. In the waterproof connector 1, a direction in which the mating connector 7 is inserted and removed is an insertion/removal direction X.

The insulating housing 3 is a molded article made of an insulating resin material and includes a housing body section 31 that is substantially tabular and supports the contacts 2, two fitting hood sections 32 and 33 that project from a front surface of the housing body section 31, which surface is to be opposite the mating connector 7, and a guide hood section 34 linked to and provided behind the housing body section 31. The guide hood section 34 has a shape that surrounds the circumference of the housing body section 31. The housing body section 31, the fitting hood sections 32 and 33, and the guide hood section 34 are integrally formed. Also, a circular first seal 35 made of an elastomer is provided on the circumference of the housing body section 31. The first seal 35, disposed on the circumference of the housing body section 31, is surrounded by the guide hood section 34 with a substantially uniform gap in between. A circular groove 34a is formed between the circumference of the first seal 35 and the guide hood section 34.

As shown in FIG. 2, the contacts 2 protrude from the front surface of the housing body section 31, along the insertion/removal direction X. The contacts 2 are surrounded by the fitting hood sections 32 and 33 and disposed with a predetermined pitch. The contacts 2 are bent on the rear side of the housing body section 31 and extend thereafter, so that the tips of the bent and extended portions of the contacts 2 are connected to the circuit board 6 (see FIG. 3).

At a lower part of the guide hood section 34, there are through-holes 34h through which screws (not shown) for fixing the insulating housing 3 to the circuit board 6 are inserted; and tapped through-holes (not shown).

The faceplate 4 is a molded article made of an insulating resin material and includes a cylindrical section 41 into which the housing body section 31 is inserted, and a brim section 42 formed at a first open end 41a of the cylindrical section 41 and spreading outwards. The cylindrical section 41 and the brim section 42 are integrally formed. A circular second seal 43, made of an elastomer, is disposed on the brim section 42 of the faceplate 4 to surround the cylindrical section 41.

A second open end 41b is positioned opposite to the first open end 41a, where the brim section 42 is provided, has a shape that conforms to the shape of the circumference of the housing body section 31 included in the insulating housing 3. The inner wall of the open end 41b is formed to be slightly smaller than the circumference of the first seal 35, so that the first seal 35 into which the housing body section 31 is inserted comes into intimate contact with the cylindrical section 41 and the housing body section 31. When installed in a enclosure 5 (see FIG. 3), the cylindrical section 41 of the faceplate 4 is inserted into a connector passageway 5h formed in the enclosure 5 (see FIG. 3). The cylindrical section 41 is formed to be smaller than the connector passageway 5h to such a degree that the cylindrical section 41 in a state of being inserted into the connector passageway 5h can move in a direction substantially perpendicular to the insertion/removal direction X, namely in the direction in which the brim section 42 spreads out.

The brim section 42 is shaped like a plate with a substantially rectangular circumference and formed to be larger than the connector passageway 5h of the enclosure 5. Disposed at four corners of the brim section 42 are four through-holes 42a, 42b, 42c and 42d.

Cylindrical reinforcing members 44a 44b, 44c and 44d, prepared from a metallic material, are embedded in these through-holes 42a through 42d, respectively. The reinforcing members 44a through 44d form insertion passageways through which fasteners 45 (see FIG. 3) are respectively inserted. The diameter of the insertion passageway, formed by each of the reinforcing members 44a through 44d, is larger than the diameter of the fastener 45 to such an extent that the brim section 42, in the state in which the fastener 45 is inserted, can move in the direction in which the brim section 42 spreads.

Subsequently, a mounting structure of the waterproof connector 1 will be described by taking an automotive electronic control unit, as an example.

Figure 3:
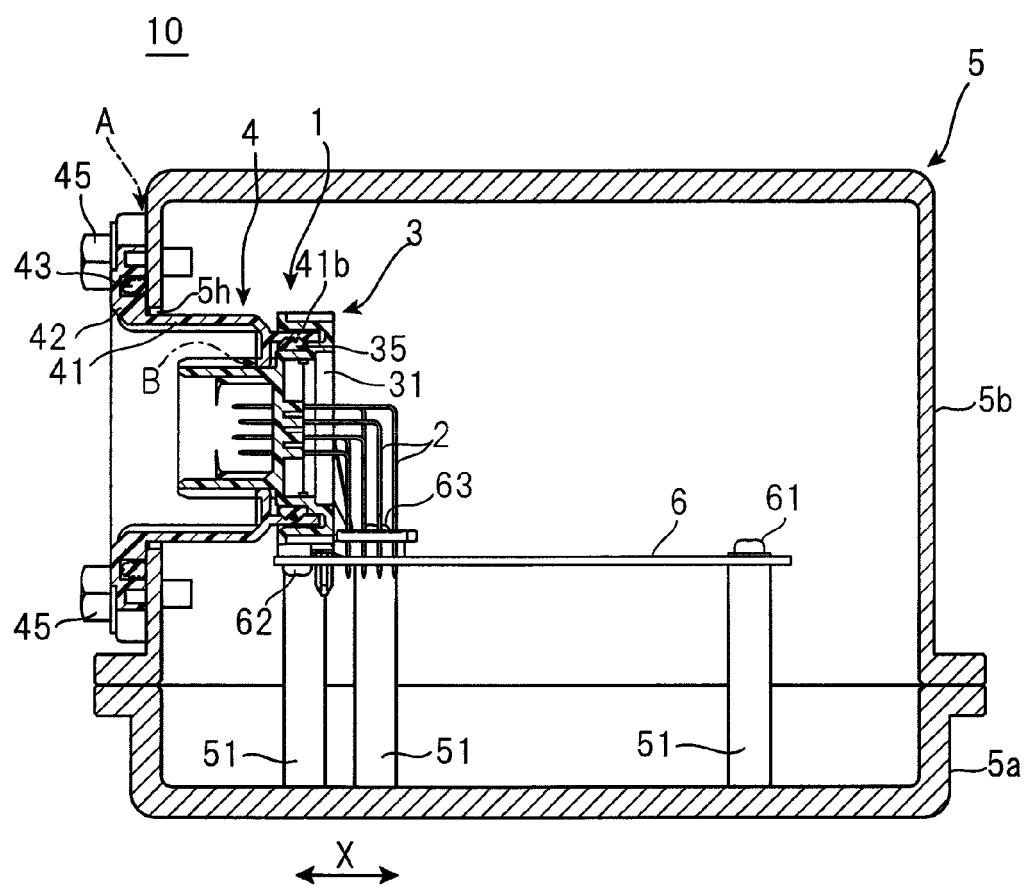
FIG. 3 is a cross-sectional view of an electronic control unit in which the waterproof connector, shown in FIG. 1 and FIG. 2, is implemented.

An electronic control unit 10 shown in FIG. 3 includes the enclosure 5, the circuit board 6 disposed in the enclosure 5, and the waterproof connector 1 mounted on the circuit board 6.

The enclosure 5 includes a base 5a to which the circuit board 6 is fixed and a cover 5b. The cover 5b having the connector passageway 5h for connecting the waterproof connector 1 to the mating connector 7, further includes tapped through-holes 5g (see FIG. 6) into which the fasteners 45 for fixing the waterproof connector 1 to the cover 5b are inserted. When the base 5a and the cover 5b are coupled to each other, the enclosure 5 is completed as an integral unit. Incidentally, illustration of a seal disposed between the base 5a and the cover 5b is omitted.

On an inner surface of the base 5a, pillar-shaped spacers 51 that support two or more circuit boards including the circuit board 6 are provided. The circuit board 6 is fixed within the enclosure 5, whereby the circuit board 6 is secured to the spacers 51 with screws 61. Incidentally, the electronic control unit 10 has such a structure in the enclosure 5 that two or more circuit boards are arranged in a vertical direction via the spacers 51, but illustration of the circuit boards except the circuit board 6 is omitted. The waterproof connector 1 is mounted on the circuit board 6 among the two or more circuit boards. The tips of the contacts 2 of the waterproof connector 1 in the state of being inserted into the circuit board 6 are connected to the circuit board 6 by soldering, and the insulating housing 3 is also secured to the circuit board 6 using screws 62 and 63. The circular first seal 35 is disposed on the circumference of the housing body section 31 of the insulating housing 3. Incidentally, besides the waterproof connector 1, multiple electronic components required for the operations of the electronic control unit 10 are accommodated on the circuit board 6, but illustration of the electronic components except the waterproof connector 1 are omitted.

The faceplate 4 of the waterproof connector 1 is fixed to the cover 5b of the enclosure 5 with the fasteners 45. The fasteners 45 passing through the cylindrical reinforcing members 44a through 44d (see FIG. 1) provided in the brim section 42 of the faceplate 4 are inserted into the tapped through-holes 5g, formed in the cover 5b. The cylindrical section 41 connecting to the brim section 42 is inserted into the connector passageway 5h. The open end 41b of the cylindrical section 41 is to be positioned inside the enclosure 5, and the housing body section 31 of the insulating housing 3 is engaged in the open end 41b with the first seal 35 interposed in between. The open end 41b of the cylindrical section 41 is closed by the insulating housing 3. The first seal 35 is in intimate contact with the circumference of the housing body section 31 and the internal circumference of the open end 41b of the cylindrical section 41.

In the electronic control unit 10, a gap A between the waterproof connector 1 and the enclosure 5 is sealed by the second seal 43 provided in the faceplate 4. Also, a gap B between the insulating housing 3 and the faceplate 4 is sealed by the first seal 35 provided in the insulating housing 3. Therefore, the enclosure 5 is made airtight securely.

In the electronic control unit 10, the insulating housing 3 is fixed to the circuit board 6, and the circuit board 6 is fixed to the enclosure 5. The installation position of the circuit board 6 with respect to the enclosure 5 and the installation position of the insulating housing 3 with respect to the circuit board 6 are allowed deviate from reference positions within installation tolerances. Because of a displacement in the installation position of the circuit board 6 with respect to the enclosure 5 and a displacement in the installation position of the insulating housing 3 with respect to the circuit board 6, the position of the insulating housing 3 with respect to the enclosure 5 deviates from a reference position.

Once the position of the insulating housing 3 with respect to the enclosure 5 occurs, the position of the housing body section 31 inserted into the cylindrical section 41 of the faceplate 4 fixed to the enclosure 5 deviates in the insertion direction, i.e. the insertion/removal direction X, displacing the faceplate 4 with respect to the enclosure 5 in a direction perpendicular to the insertion/removal direction X, i.e. the direction in which the brim section 42 spreads. Even in this situation, the state in which a gap between the insulating housing 3 and the cylindrical section 41 is sealed by the first seal 35 is maintained. Also, the state in which the connector passageway 5h is closed by the brim section 42 is maintained.

Subsequently, a method of mounting the waterproof connector 1 shown in FIG. 1 on the circuit board 6 and assembling the electronic control unit 10 shown in FIG. 3 will be described. The assembly method of the electronic control unit 10 includes a housing mounting process, a board fixing process, a faceplate 4 attachment process, a faceplate 4 insertion process and a faceplate 4 fixing process.

Figure 4:
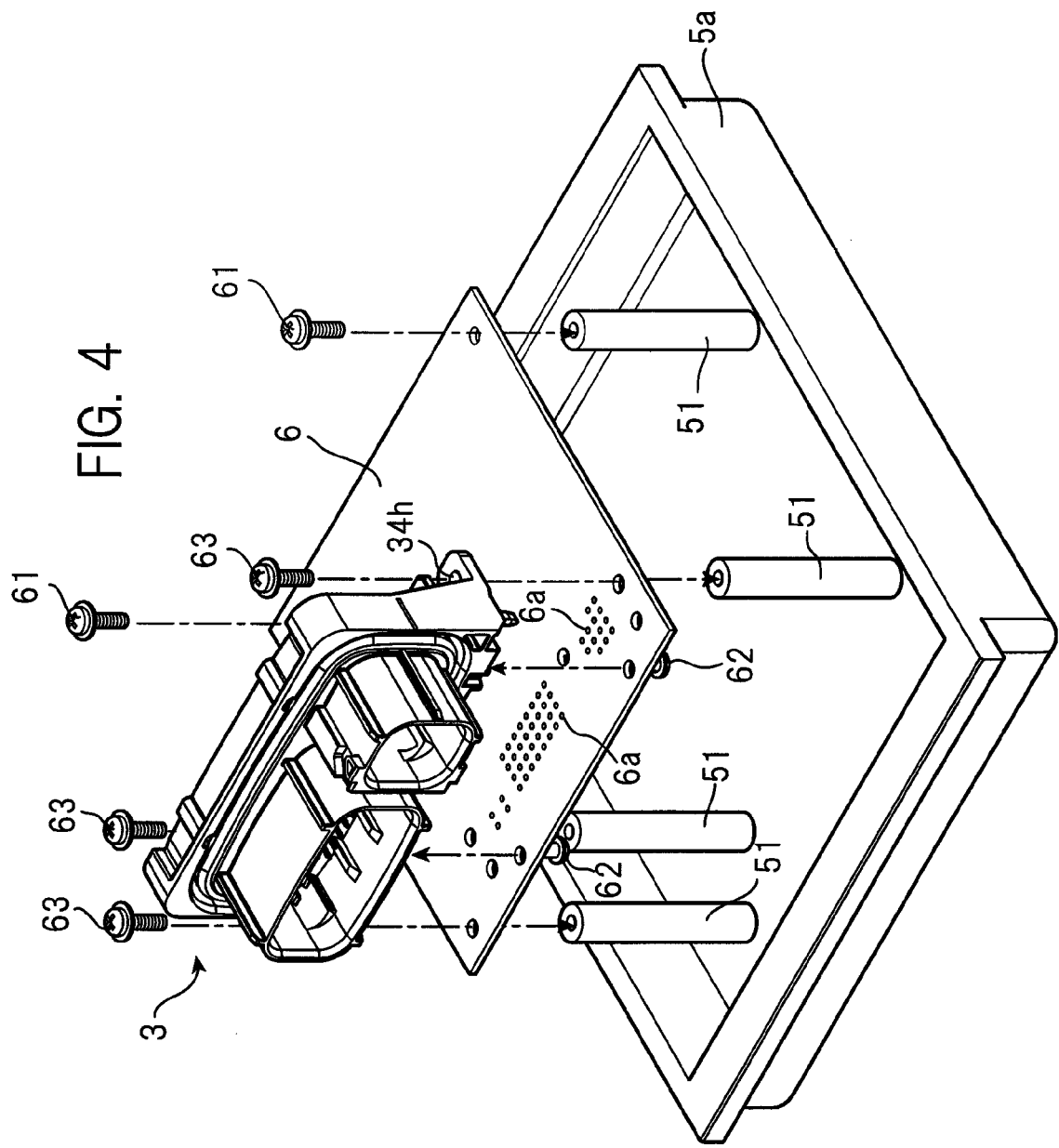
FIG. 4 is a exploded view showing a housing mounting process and a board fixing process of an assembly method of the electronic control unit shown in FIG. 3.

FIG. 4 illustrates the housing mounting process and the board fixing process together to readily view the positional relations between the components.

First, in the housing mounting process, the insulating housing 3 of the waterproof connector 1 is mounted on the circuit board 6. To be more specific, the insulating housing 3 is attached on the circuit board 6 by making the contacts 2 (see FIG. 2) pass through holes 6a of the circuit board 6. Subsequently, the screws 62 are made to pass through the circuit board 6 and inserted into the tapped openings formed on a lower surface of the guide hood section 34 of the insulating housing 3, thereby securing the insulating housing 3 to the circuit board 6.

Subsequently, in the board fixing process, the circuit board 6 to which the insulating housing 3 is fixed in the housing mounting process, is secured to the enclosure 5. The circuit board 6 is disposed on the spacers 51, which are provided on the base 5a of the enclosure 5, and then, the screws 61 and 63 are inserted into the tips of the spacers 51 after passing through the circuit board 6 and tightened to secure. The screws 63 are inserted into the spacers 51 after passing through the through-holes 34h formed in the insulating housing 3 and the circuit board 6, so that the fixing of the insulating housing 3 and the circuit board 6 is reinforced.

Figure 5:
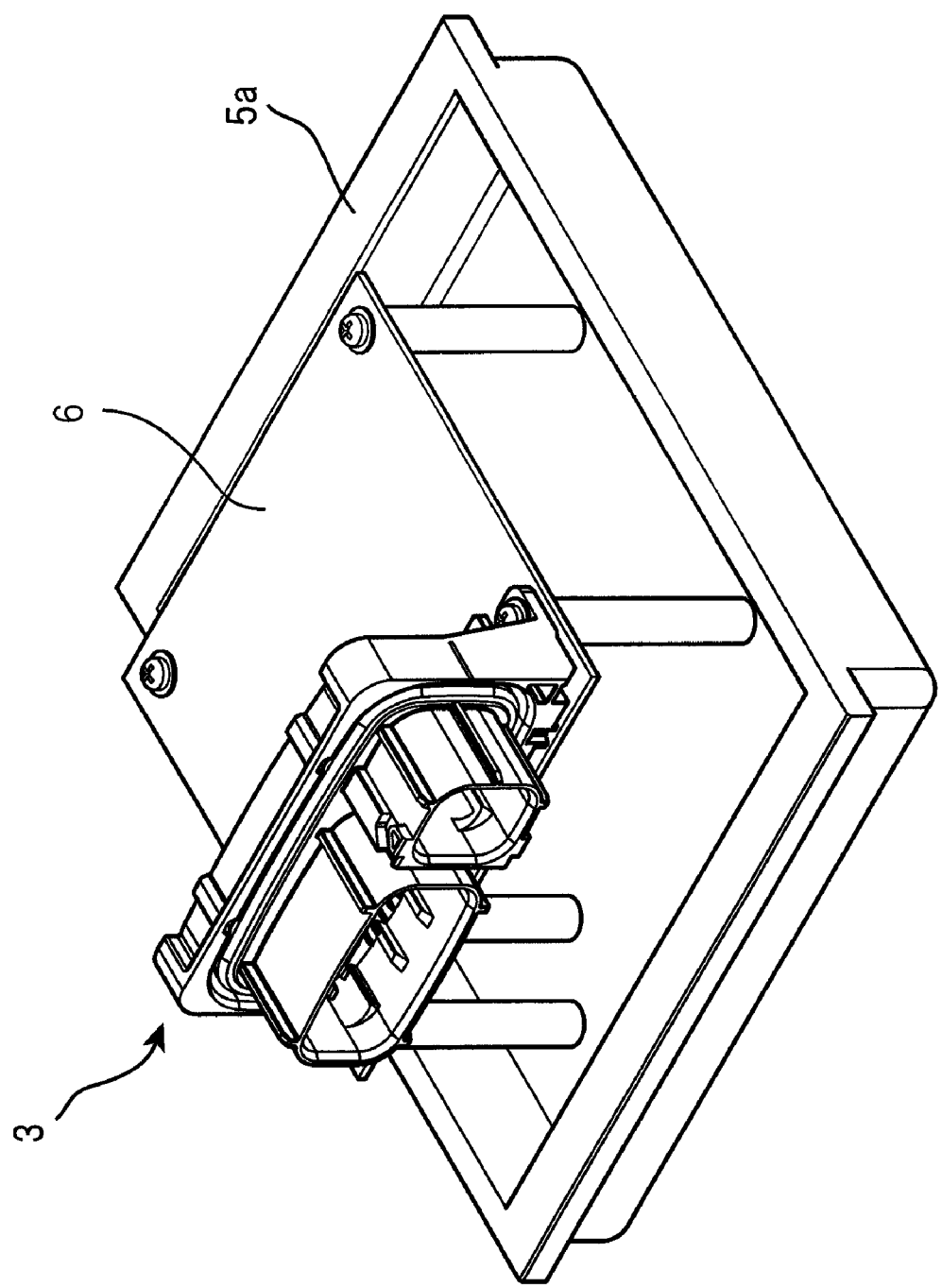
FIG. 5 is a perspective view showing a state in which a circuit board is fixed to a base of a enclosure by going through the board fixing process and the housing mounting process.

By going through the housing mounting process and board fixing process, the insulating housing 3 is fixed to the circuit board 6, and the circuit board 6 is fixed to the base 5a of the enclosure 5 as shown in FIG. 5.

Figure 6:
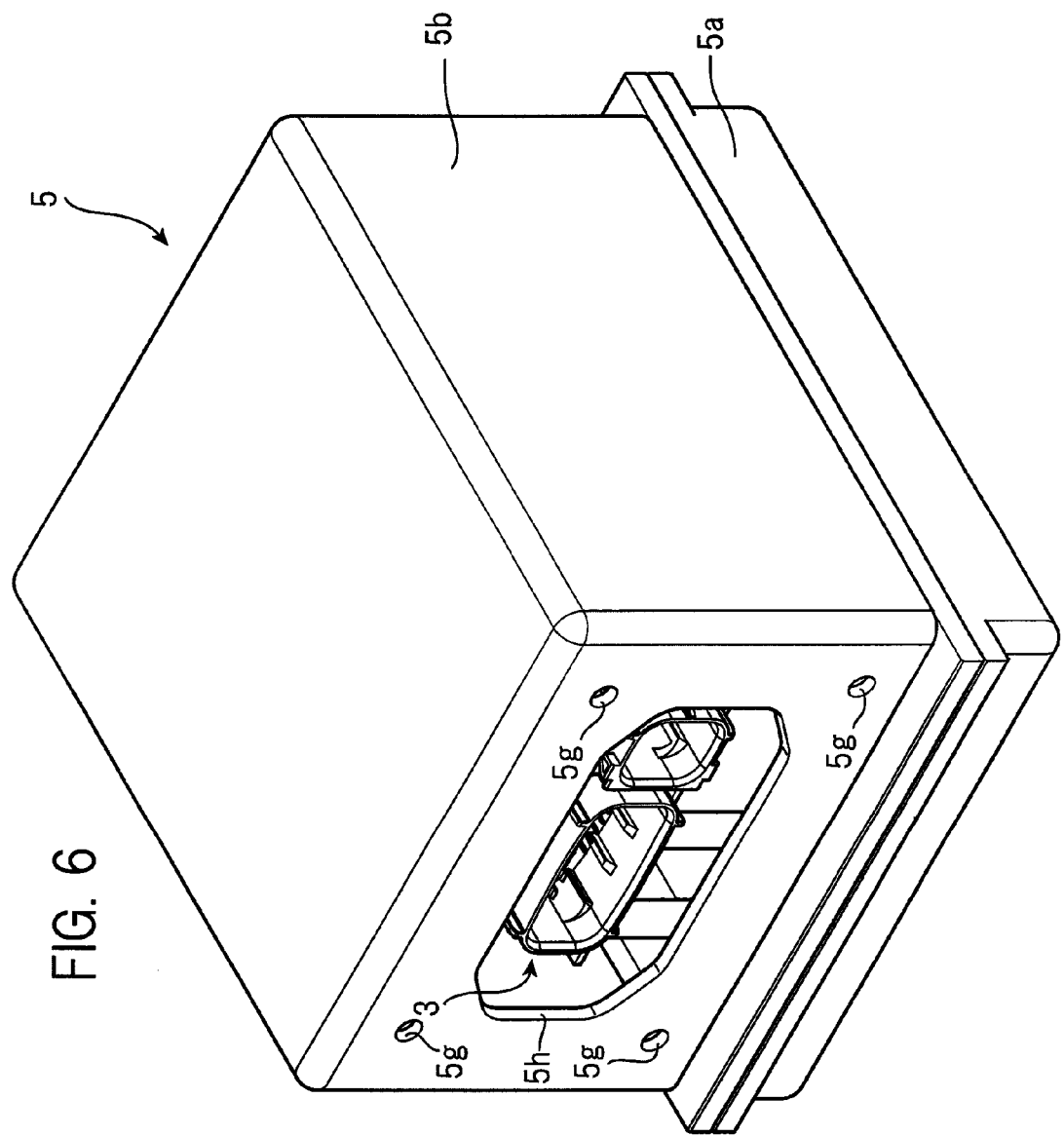
FIG. 6 is a perspective view showing a faceplate attachment process.
Figure 7:
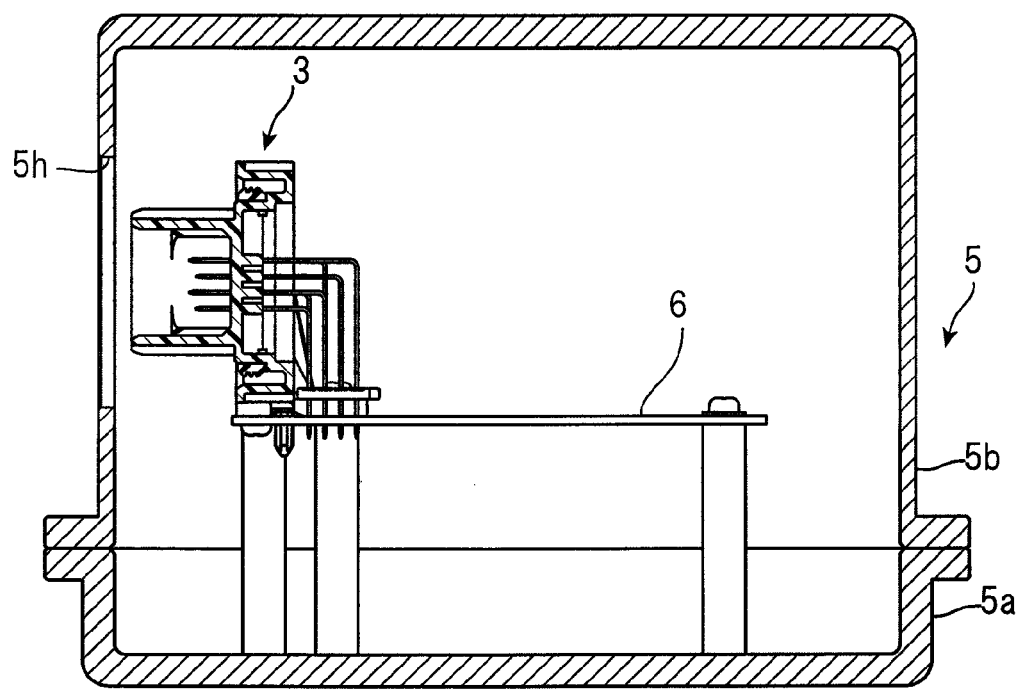
FIG. 7 is a cross-sectional view showing the faceplate attachment process.

FIG. 6 and FIG. 7 illustrate the faceplate 4 attachment process where the cover 5b is coupled to the base 5a on which the insulating housing 3 and the circuit board 6 are fixed. The base 5a and the cover 5b are tightly connected to each other with no gap in between. The base 5a and the cover 5b are coupled to each other with a seal (not illustrated) interposed between the base 5a and the cover 5b. The base 5a and the cover 5b may be fastened to each other with screws and the like, or may be fixed to each other with, for example, an adhesive. When the cover 5b and the base 5a are united, the enclosure 5 is completed.

Figure 8:
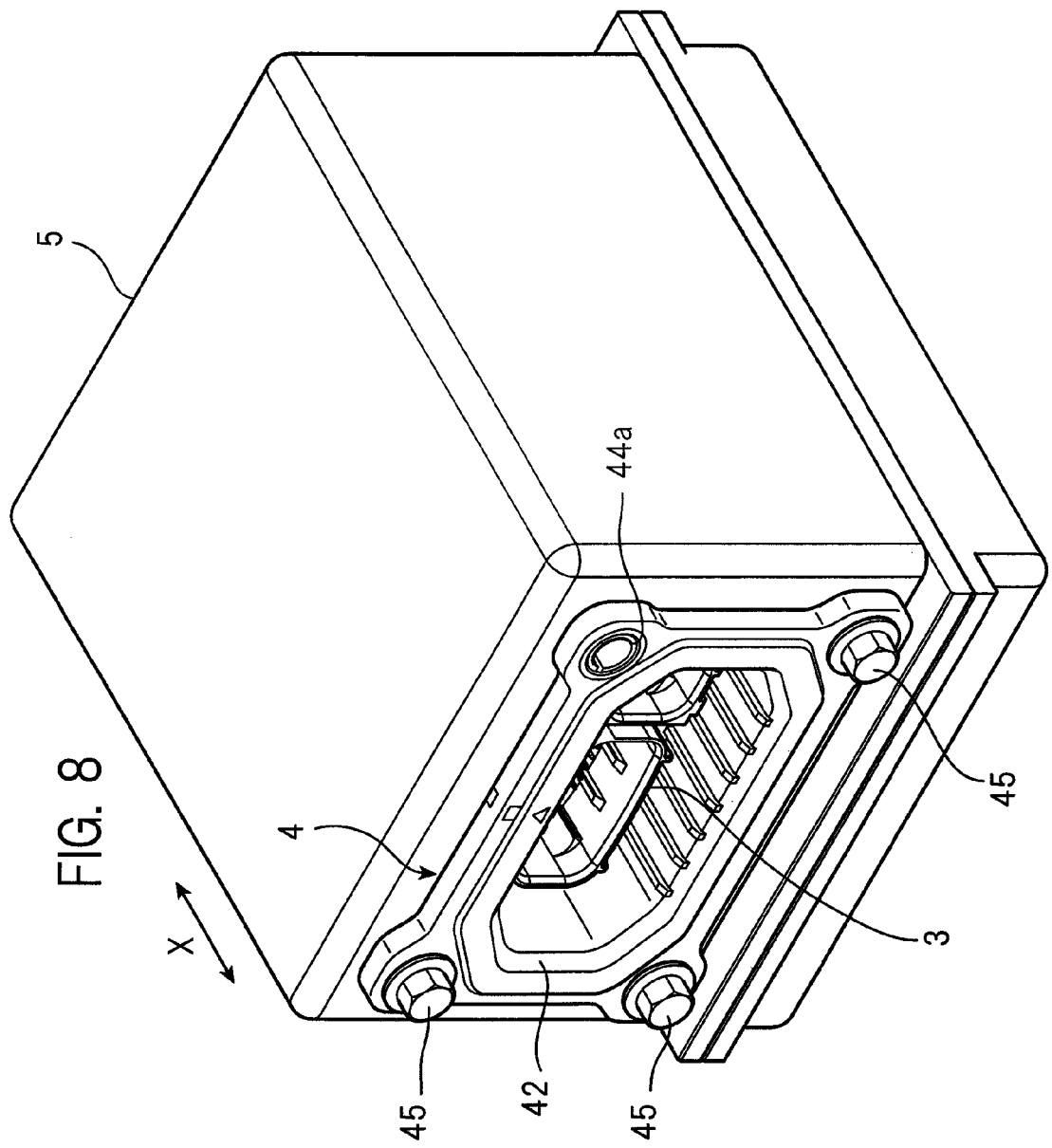
FIG. 8 is a perspective view showing a faceplate insertion process and a faceplate fixing process.
Figure 9:
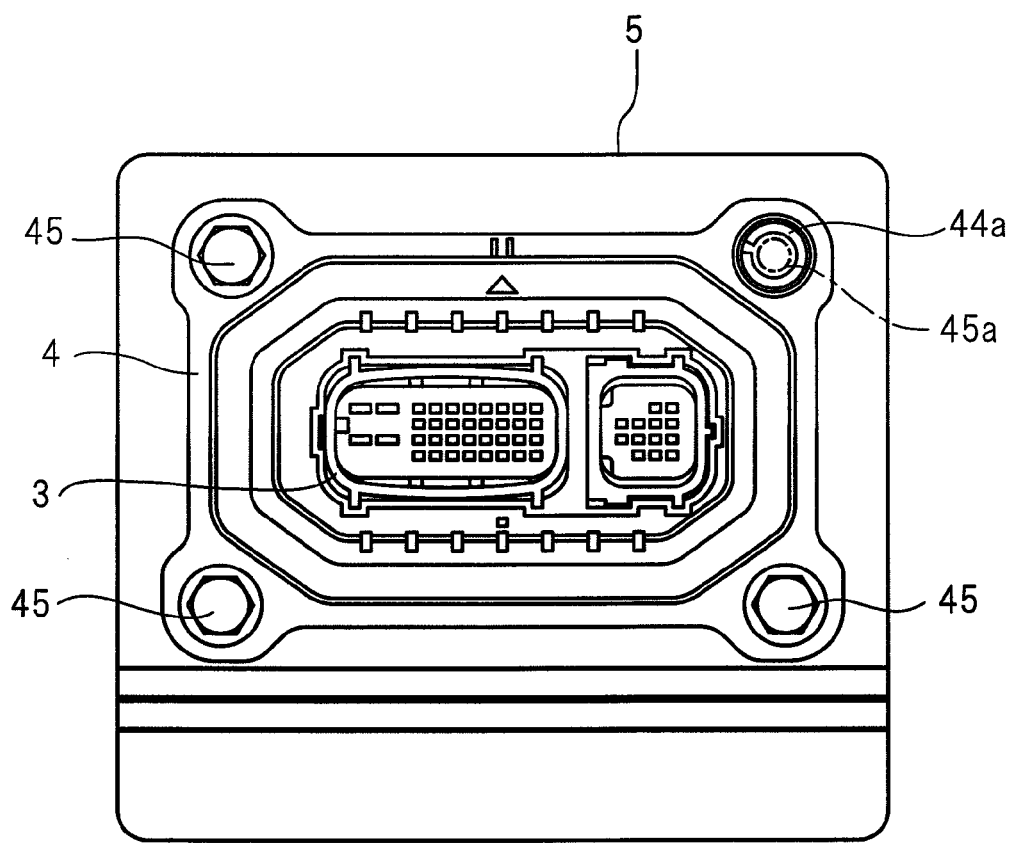
FIG. 9 is a front view showing the faceplate insertion process and the faceplate fixing process.

FIG. 8 and FIG. 9 illustrate the faceplate 4 insertion process and the faceplate 4 fixing process. First, the faceplate 4 insertion process, the faceplate 4 is attached to the insulating housing 3 and the enclosure 5. To be more specific, the cylindrical section 41 of the faceplate 4 with the open end 41b (see FIG. 1) directed toward the inside of the enclosure 5 is inserted into the connector passageway 5h (see FIG. 5), and the housing body section 31 (see FIG. 1) of the insulating housing 3 is fitted into the open end 41b. As shown in FIG. 1, the open end 41b of the cylindrical section 41 is guided to the groove 34a formed between the guide hood section 34 and the housing body section 31, and engaged in the insulating housing 3. The faceplate 4 is inserted until the brim section 42 abuts the enclosure 5. The brim section 42 is larger than the connector passageway 5h, and abuts the enclosure 5 while closing the edge of the connector passageway 5h from the outside of the enclosure 5. Corresponding to displacement of the position of the insulating housing 3, the faceplate 4 is attached to the enclosure 5 at a position deviated from a reference position, in a direction perpendicular to the insertion/removal direction X.

Subsequently, in the faceplate 4 fixing process, the four fasteners 45 are inserted into the insertion openings formed by the respective reinforcing members 44a through 44d of the brim section 42. In this state, the four fasteners 45 are inserted into the tapped through-holes 5g (see FIG. 6) formed in the enclosure 5, and tightened. Incidentally, FIG. 8 and FIG. 9 illustrate a state in which among the four fasteners 45 for fixing the faceplate 4, three fasteners 45 (not shown) are already tightened. In FIG. 9, an outer diameter 45a of the thread part of the fastener 45 is indicated with a chain line in an area where the fastener 45 has not yet been inserted. As shown in FIG. 9, the insertion openings formed by the respective reinforcing members 44a through 44d are larger than the outer diameter 45a of the thread part of the fastener 45. Therefore, the faceplate 4 is reliably fixed to the enclosure 5 even when disposed at a position deviated from a reference position. When the fixing by tightening the four fasteners 45 is completed, the assembly of the electronic control unit 10 shown in FIG. 3 is finished.

In the assembly of the electronic control unit 10, shown in FIG. 4 through FIG. 9, the faceplate 4 is fixed to the enclosure 5 in such a manner that the faceplate 4 is pushed from the outside and fitted through the connector passageway 5h into the enclosure 5, to which the insulating housing 3 and the circuit board 6 are secured. Only by fixing the faceplate 4 in this manner, a waterproof structure is completed.

Figure 10:
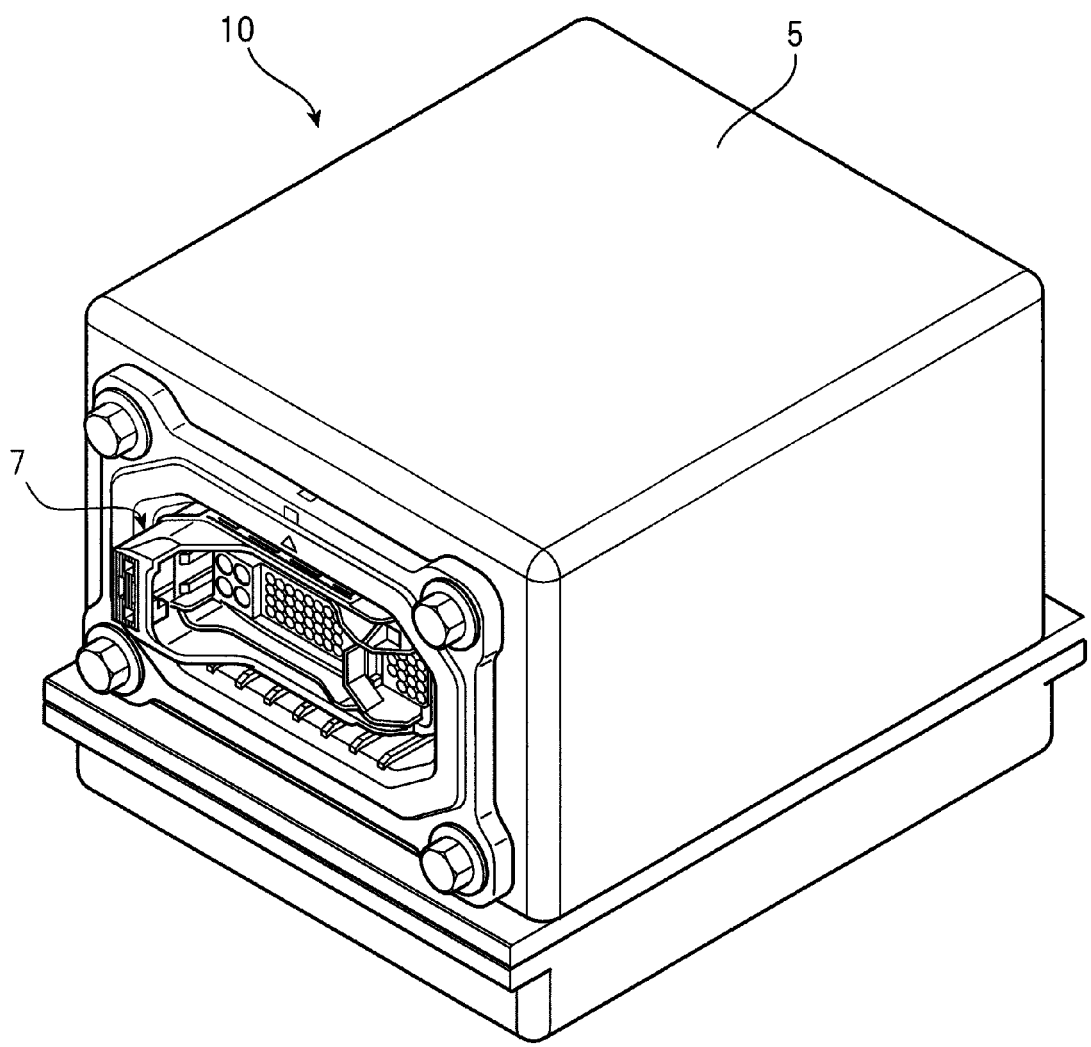
FIG. 10 is a perspective view showing a state in which a mating connector is connected to the electronic control unit.
Figure 11:
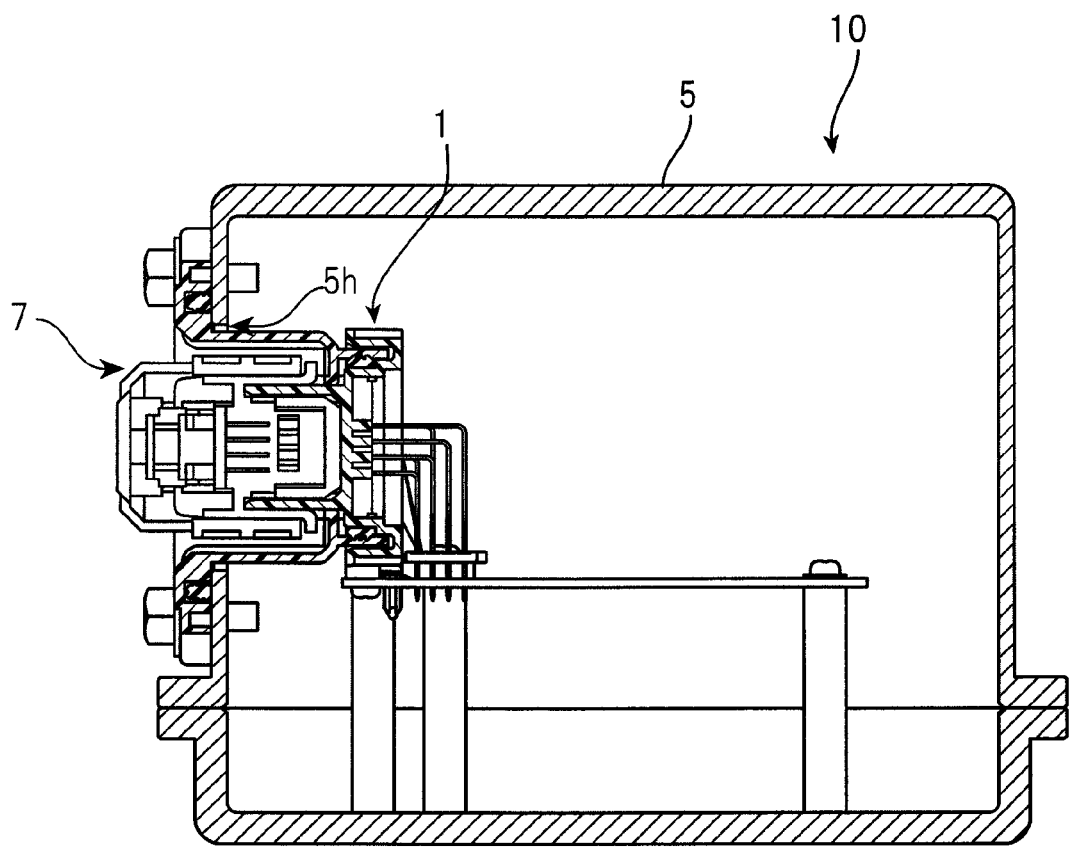
FIG. 11 is a cross-sectional view showing the state in which the mating connector is connected to the electronic control unit.
Figure 12:
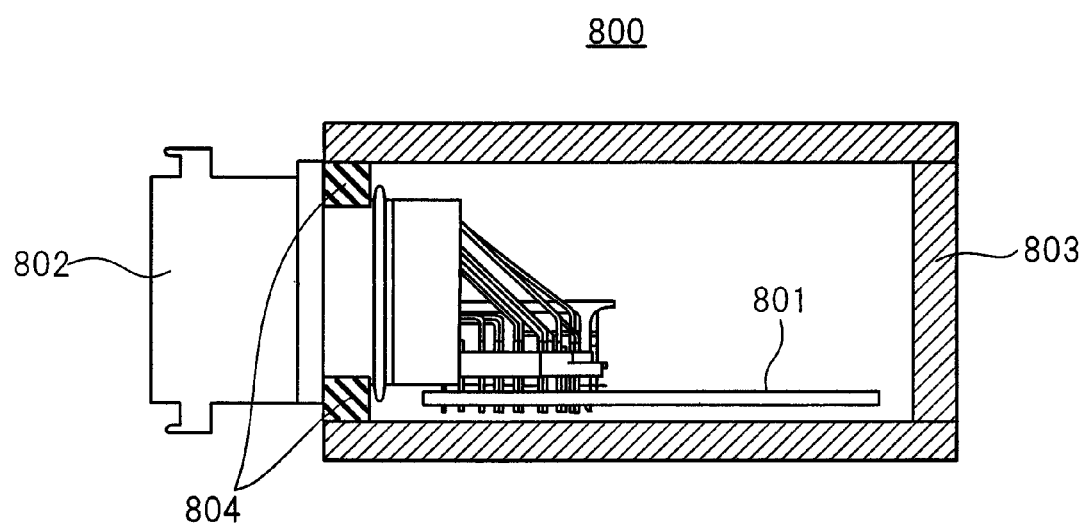
FIG. 12 is a cross-sectional view showing an internal structure of a conventional electronic device.
Figure 13:
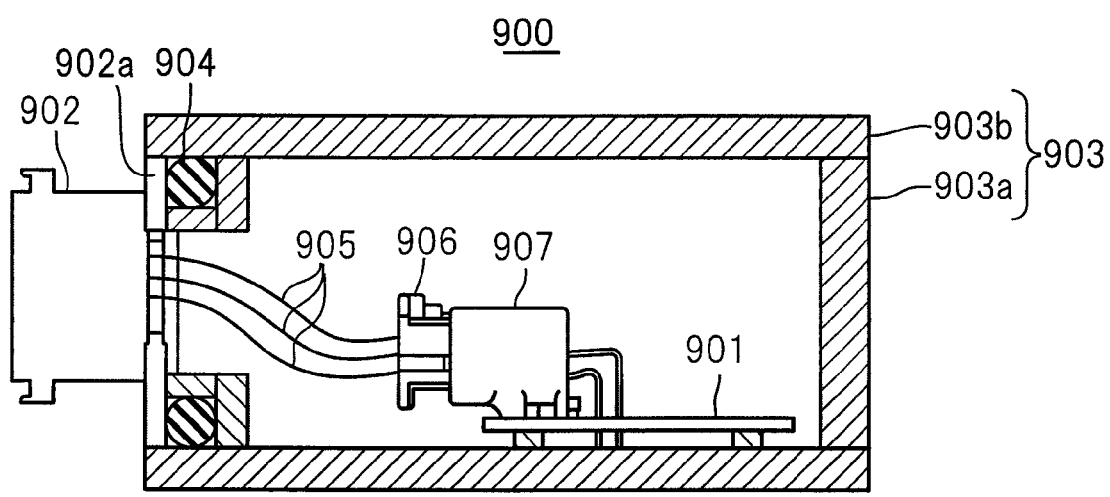
FIG. 13 is a cross-sectional view showing an internal structure of another conventional electronic device.

FIG. 10 and FIG. 11 illustrate a state in which the mating connector 7 is connected to the electronic control unit 10, shown in FIG. 3. In FIG. 11, hatching of the mating connector 7 is omitted so that the structure can be readily viewed.

As shown in FIG. 10 and FIG. 11, the mating connector 7 is mated with the waterproof connector 1 provided in the electronic control unit 10 through the connector passageway 5h formed in the enclosure 5.

Incidentally, in the above description of the embodiment, it is assumed that the invention is applied to the automotive electronic control unit 10. However, the invention is not limited to the automotive electronic control unit 10 and may be applied to various types of electronic device required to be waterproofed.

Further, in the above description of the embodiment, there is employed the example in which the insulating housing 3 has the guide hood section 34. However, the invention is not limited to this example and may have, for example, a structure in which the insulating housing 3 does not have the guide hood section 34.

Furthermore, the assembly method of the electronic control unit 10 of the embodiment has been described by using the example in which the housing mounting process, the board fixing process, the faceplate 4 attachment process, the faceplate 4 insertion process and the faceplate 4 fixing process are sequentially carried out. However, the present invention is not limited to this example and, for example; the housing mounting process may be executed after the board fixing process.

According to the invention, the structure in which the circuit board 6 is fixed to the enclosure 5 is adopted, and no gap that allows liquid or air to enter externally is formed even when the installation position of the circuit board 6 with respect to the enclosure 5 is displaced and the installation position of the insulating housing 3 with respect to the circuit board 6 is displaced.

Accordingly, in the waterproof connector 1 of the present invention, an airtight structure is completed only by fitting the faceplate 4, via the connector hole, into the enclosure 5 to which the insulating housing 3 and the circuit board 6 are fixed, thereby securing the faceplate 4 to the enclosure 5. This structure does not require components such as the relay connector and internal wires like those used in the conventional technique, making it possible to carry out assembly work readily and reliably. In addition, since the components such as internal wires are not required, the number of contact points between components is decreased, thereby improving reliability.

As described above, according to the present invention, there are realized the waterproof connector 1, the mounting structure of the waterproof connector 1 and the mounting method of the waterproof connector 1, in which a displacement of the position of the waterproof connector 1 with respect to the enclosure 5 is allowed while preventing an increase in the number of components and the number of work processes.

Besides these, the configurations described in the above-described embodiment can be selected optionally or can be changed appropriately to other configurations without departing from the spirit and scope of the present invention.

What is claimed is:

1. A mounting structure, comprising:
   a circuit board;
   an enclosure having a connector passageway;
   a contact connected to the circuit board and electrically connectable with a mating connector;
   an insulating housing holding the contact;
   a first seal disposed on a circumference of the housing;
   a faceplate into which the insulating housing is inserted, the faceplate having a cylindrical section and a brim section, the cylindrical section having first and second open ends and the brim section being located at the first open end and spreading outwards, the cylindrical section passing through the connector passageway and the brim section closing an edge of the connector passageway from the outside of the enclosure; and
   a second seal interposed between the first open end and the insulating housing.

2. The mounting structure according to claim 1, wherein the insulating housing is a molded article made from a resin material.

3. The mounting structure according to claim 2, wherein the insulating housing further comprises a housing body section being substantially tubular and supporting the contact.

4. The mounting structure according to claim 3, wherein the insulating housing further comprises at least one fitting hood section projecting from a front surface of the housing body section.

5. The mounting structure according to claim 4, wherein the insulating housing further comprises a guide hood section linked to and located behind the housing body section.

6. The mounting structure according to claim 5, further comprising a circular groove formed between a circumference of the first seal and the guide hood section.

7. The mounting structure according to claim 1, wherein the brim section further comprises at least one through-hole into which a fastener for fixing the faceplate to the enclosure is inserted.

8. The mounting structure according to claim 7, further comprising a cylindrical reinforcing member disposed in the at least one through-hole, the cylindrical reinforcing member forming an insertion passageway through which the fastener may be inserted.

9. The mounting structure according to claim 8, wherein a diameter of the insertion passageway is larger than a diameter of the fastener.

10. The waterproof connector according to claim 4, wherein the contact protrudes from the front surface of the housing body section and is surrounded by the at least one fitting hood section.

11. A method of mounting a waterproof connector, the method comprising:
- fixing a circuit board to a base of a enclosure;
- fixing an insulating housing to the circuit board;
- coupling a cover of the enclosure to the base;
- inserting a faceplate into a connector passageway of the cover, the faceplate having a cylindrical section and a brim section, the cylindrical section includes first and second open ends and the brim section being formed at the first open end and spreading outwards;
- fitting the insulating housing into the second open end, and fixing the brim section to the enclosure.

\* \* \* \* \*